United States Patent [19]
Sudo et al.

[11] Patent Number: 5,192,914
[45] Date of Patent: Mar. 9, 1993

[54] CLOCK CONTROL CIRCUIT FOR SUPPRESSING CLOCK PULSES

[75] Inventors: Kiyoshi Sudo, Tokyo; Yasutomo Sakurai; Koichi Odahara, both of Kawasaki; Kenji Hoshi, Yokohama; Hideharu Kanaya, Kawasaki, all of Japan

[73] Assignee: Fujitsu Limited, Japan

[21] Appl. No.: 731,127

[22] Filed: Jul. 15, 1991

[30] Foreign Application Priority Data

Jul. 20, 1990 [JP] Japan .................. 2-193738

[51] Int. Cl.⁵ .................. H03K 17/00; H03K 19/00
[52] U.S. Cl. .................. 328/72; 328/109; 307/480; 307/518
[58] Field of Search .................. 307/480, 269, 518; 375/106; 328/63, 72, 109, 110

[56] References Cited
U.S. PATENT DOCUMENTS 4,780,890 10/1988 Kane .................. 307/269
4,961,013 10/1990 Obermeyer et al. .................. 307/480
4,998,025 3/1991 Watanabe .................. 307/480

Primary Examiner—William L. Sikes
Assistant Examiner—Toan Tran
Attorney, Agent, or Firm—Welsh & Katz, Ltd.

[57] ABSTRACT

In a clock control circuit for suppressing a clock pulse in a plurality of devices which operate in synchronization with each other, the clock control circuit detects first and second clock suppress conditions, generates a first clock suppress signal in all the devices based on the detection of the first clock suppress condition, generates a second clock suppress signal in a particular device based on the detection of the first or second clock suppress conditions, transmits the clock suppress signals to all the devices, and suppresses the clock pulse in all the devices based on the first and second clock suppress signals. The second clock suppress signal suppresses the clock pulse after it is suppressed by the first clock suppress signal, and continues to suppress the clock pulse until a suppression release signal is received.

13 Claims, 5 Drawing Sheets

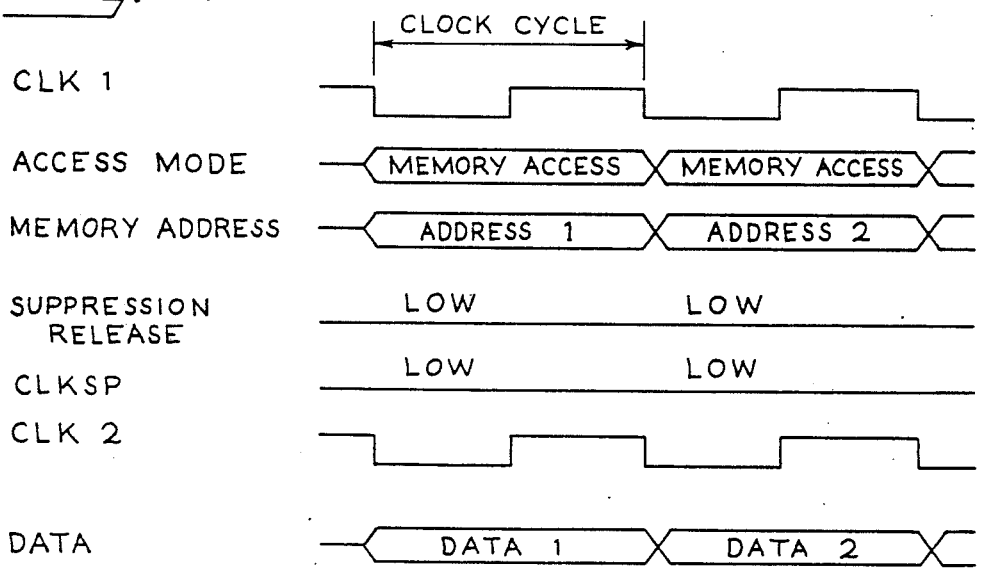
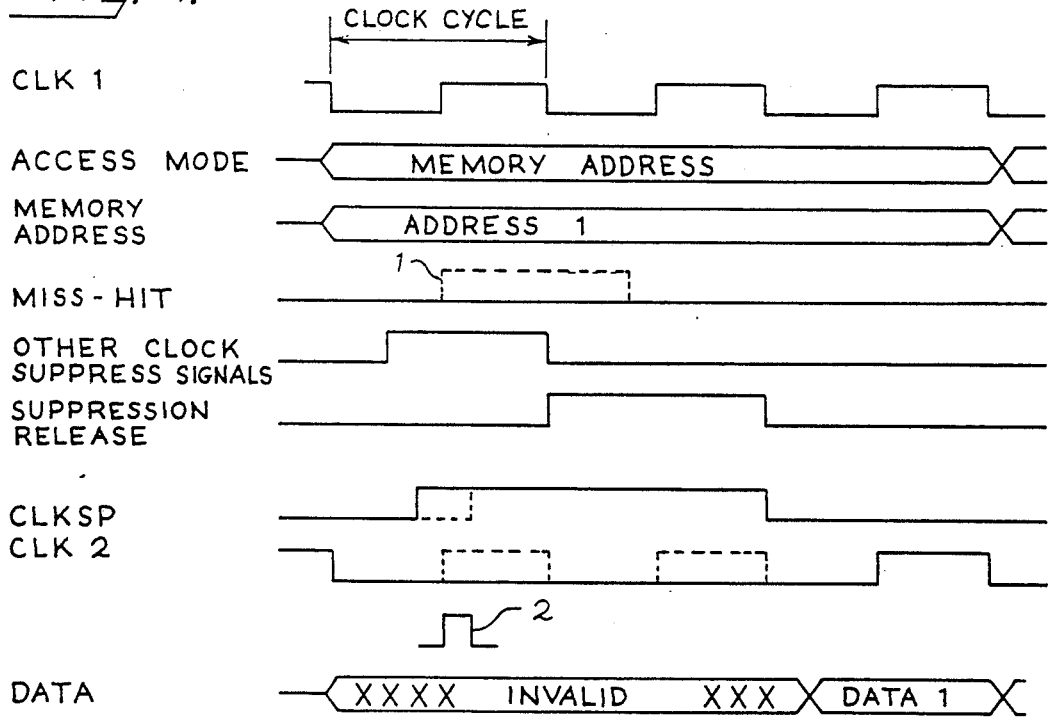

CLOCK CONTROL CIRCUIT FOR SUPPRESSING CLOCK PULSES

BACKGROUND OF THE INVENTION

1. Field of the Invention

The present invention relates to a clock control circuit, and more particularly to a circuit for suppressing a clock pulse.

A data processing system consists usually of a plurality of logic modules or large-scale integrated circuits (LSI's) (hereinafter called "devices") which are located apart from each other and interchange data to perform data processing. The devices operate in synchronization with each other by means of the same system clock pulse to transfer a unit of data between the devices within a predetermined time, or a predetermined number of clock cycles. However, if a particular condition occurs in which data cannot be transferred within the predetermined time, the clock pulse has to be suppressed to wait for the data to be transferred (hereinafter such condition is called a "clock suppress condition").

Since a memory cycle and, therefore, a clock cycle must be set to accommodate the longest time possible required by the suppress conditions, the time required to transfer data is increased. This reduces the processing speed of a data processing system. Therefore, a clock control circuit which does not reduce system performance in this manner is in great demand.

2. Description of the Related Art

The related art is described taking a computer system with buffer memory (or cache memory) as an example.

FIG. 1 is a block diagram of a computer system for practicing the present invention. FIG. 2 is a circuit showing the first related art. FIG. 3 is a timing chart showing the occurrence of a cache hit to the circuit of FIG. 2. FIG. 4 is a timing chart showing the occurrence of a suppress condition to the circuit of FIG. 2. FIG. 5 is a circuit showing second related art. FIG. 6 is a timing chart showing the occurrence of a cache hit to the circuit of FIG. 5. FIG. 7 is a timing chart showing the occurrence of a clock suppress condition to the circuit of FIG. 5.

In FIG. 1, a memory access controller 11 generates a clock suppress signal or clock suppress request signal (CLKSP/CLKSPRQ), and sends the signal to all the devices, including itself, to perform a clock suppression. A processor unit CPU 12 accesses a buffer memory 13, registers 16 and a main memory 15, and performs arithmetic and logical operations. The buffer memory 13 tries to access the addressed data thereof and, when the addressed data is not found, activates a MISS-HIT signal. A clock generator 14 generates a system clock pulse CLK1 and distributes it to all the devices. A bus 6 carries data, address, access mode and other control signals among the memory access controller 11, CPU 12 and buffer memory 13. A bus 7 carries data, address, access mode and other control signals among the main memory 15, registers 16 and memory access controller 11. A receive clock pulse CLK2, which may be suppressed when necessary, sets the data sent in a data register (not shown) in a device which receives the data.

In a so-constructed buffer memory system, the CPU 12 sends the access mode on the bus 6 as a memory access mode and address to which data is to be accessed. When the addressed data is in the buffer memory 13, the data is output onto the bus 6 without suppressing the receive clock pulse CLK2, and the data is received by the CPU 12 in 1 memory cycle, i.e., 1 clock cycle. When the addressed data is not in the buffer memory 13, the buffer memory 13 activates the MISS-HIT signal. On receipt of the MISS-HIT signal through a miss-hit detector 19, the memory access controller 11 sends the clock suppress or a clock suppress request signal CLKSP/CLKSPRQ to the CPU 12 through the clock suppress signal generator 17 for clock suppression and makes an access to (i.e., reads) the main memory 15 instead, to read the addressed data therefrom. After outputting the data read onto the bus 6, the memory access controller 11 releases the clock suppression.

On receipt of the CLKSP/CLKSPRQ signal, the CPU 12 suppresses the receive clock pulse CLK2 so that the CPU 12 does not attempt to receive data on the bus 6 and, when the clock suppression is released and the CLKSP/CLKSPRQ signal is deactivated, receives the data from the bus 6 by not suppressing the receive clock pulse CLK2.

When the CPU 12 reads data from the registers 16 or main memory 15, clock suppression is required because the data read has to be transferred from the bus 7 to the bus 6. In this case, a clock suppress condition detector 18 detects a clock suppress condition based on the access mode to perform a clock suppression as for the above-described cache miss (or miss-hit) condition.

In a system with a buffer memory as described above, a particular device (e.g., the memory access controller 11 in the example) detects a clock suppress condition and generates the clock suppress or a clock suppress request signal (CLKSP/CLKSPRQ) for clock suppression for other devices (e.g., CPU 12).

FIG. 2 is a circuit showing the first related art, where data is received in 1 clock cycle.

The MISS-HIT signal from the buffer memory 13 is ORed with other clock suppress signals 21 by an OR gate G11 and input to the terminal J of a J-K flip-flop FF11 to be held there. The output of the OR gate G11 and that of the flip-flop FF11 are ORed by an OR gate G12 to output a clock suppress signal CLKSP to the CPU 12. When a suppression release signal is input to the terminal K of the flip-flop FF11, the clock suppress signal CLKSP is deactivated.

In the CPU 12, the signal CLKSP received is input through an invertor N2 to an AND gate G21, by which the system clock pulse CLK1 is gated to produce a receive clock pulse CLK2. In the memory access controller 11, too, the system clock pulse CLK1 is gated by an AND gate G13 to produce a receive clock pulse CLK2.

FIG. 3 is a timing chart showing the occurrence of a cache hit to the circuit of FIG. 2, i.e., a timing chart showing a case where no clock suppress condition occurs. The figure shows that the receive clock pulse CLK2 is not suppressed with the clock suppress signal CLKSP not activated (low) and the data read from the buffer memory 13 is received by the CPU 12 in 1 clock cycle.

FIG. 4 is a timing chart showing the occurrence of a clock suppress condition to the circuit of FIG. 2. A clock suppress signal CLKSP, which is generated from the time a clock suppress signal rises until a suppression release signal falls, suppresses the receive clock pulse CLK2 during two clock cycles. The CPU 12 receives the data on the bus 6 with the receive clock pulse CLK2 occurring after the clock suppression is released.

FIG. 5 is a circuit showing the second related art, i.e., a circuit for the case where two clock cycles are required for data to be received. The memory access controller 11 outputs a clock suppress request signal CLKSPRQ through the clock suppress signal generator 17. In the CPU 12, the clock suppress request signal CLKSPRQ is input to a D-type flip-flop FF21 to generate a clock suppress signal CLKSP after 1 clock cycle.

FIG. 6 is a timing chart showing the occurrence of a cache hit to the circuit of FIG. 5. The figure shows that the receive clock pulse CLK2 is not suppressed and the data on the bus 6 is received by the CPU 12 in 2 clock cycles.

FIG. 7 is a timing chart which shows occurrence of a clock suppress condition to the circuit of FIG. 5. The receive clock pulse CLK2 is suppressed in the clock cycles following the 1 clock cycle where a clock suppress signal occurs and restarts when the clock suppression is released to receive the data.

A clock suppress signal must be valid well before the leading edge of the clock pulse to be suppressed. As described above, however, since it takes a comparatively long time to determine a cache miss and since the MISS-HIT signal comes from outside of the memory access controller 11, the memory access controller 11 requires a longer time before detecting a cache miss compared with other clock suppress signals (See reference numeral 1 in FIG. 4).

Accordingly, as the clock suppress signal CLKSP resulting from a cache miss reaches the CPU 12 later, the receive clock pulse CLK2 fails to be suppressed (See a glitch 2 in FIG. 4), thus causing the CPU 12 to receive invalid data. The same is true of the circuit of FIG. 5. To avoid this, the period of the system clock pulse CLK1 must be longer.

According to the conventional clock control circuit as described above, since the system clock frequency had to be set low because of a particular clock suppress condition which takes time to be determined, such as a cache miss, a problem is that it reduces the processing speed and therefore, reduces the performance of the data processing system.

SUMMARY OF THE INVENTION

It is an object of the present invention to provide an economic clock control circuit which can shorten a memory cycle and increase the processing speed of a data processor.

It is another object of the present invention to provide a clock control circuit which can reduce clock suppression and increase the processing speed of a data processor.

It is still another object of the present invention to provide a clock control circuit which can prevent a particular clock suppress condition from causing a clock suppression.

To achieve the above and other objects, the present invention provides first detection means, second detection means, a plurality of first clock suppress signal generator means, second clock suppress signal generator means, and a plurality of clock suppression means. In a clock control circuit for suppressing a clock pulse in a plurality of devices which operate in synchronization with each other, the first detection means detects a first clock suppress condition, and the second detection means detects a second clock suppress condition. A plurality of first clock suppress signal generator means, provided in each of the devices and operatively connected in parallel to the first detection means, generates a clock suppress signal based on the detection of a clock suppress condition by the first detection means. The second clock suppress signal generator means, which is provided in a particular device, generates a clock suppress signal based on the detection of a clock suppress condition by the first or second detection means. A plurality of clock suppression means, provided in each of the devices and operatively connected in parallel to the first and second clock suppress signal generator means, suppresses the clock pulse based on the clock suppress signals from the first and second clock suppress signal generator means. The second clock suppression signal generator means suppresses the clock pulse after it is suppressed by the first clock suppression generator means, and continues to suppress the clock pulse until a suppression release signal releases the second clock suppression signal generator means.

BRIEF DESCRIPTION OF THE DRAWINGS

FIG. 3 is a timing chart showing the occurrence of a cache hit to the circuit of FIG. 2;

FIG. 4 is a timing chart showing the occurrence of a suppress condition to the circuit of FIG. 2;

Throughout the above-mentioned drawings, identical reference numerals are used to designate the same or similar component parts.

DESCRIPTION OF THE PREFERRED EMBODIMENTS

Figure 8:
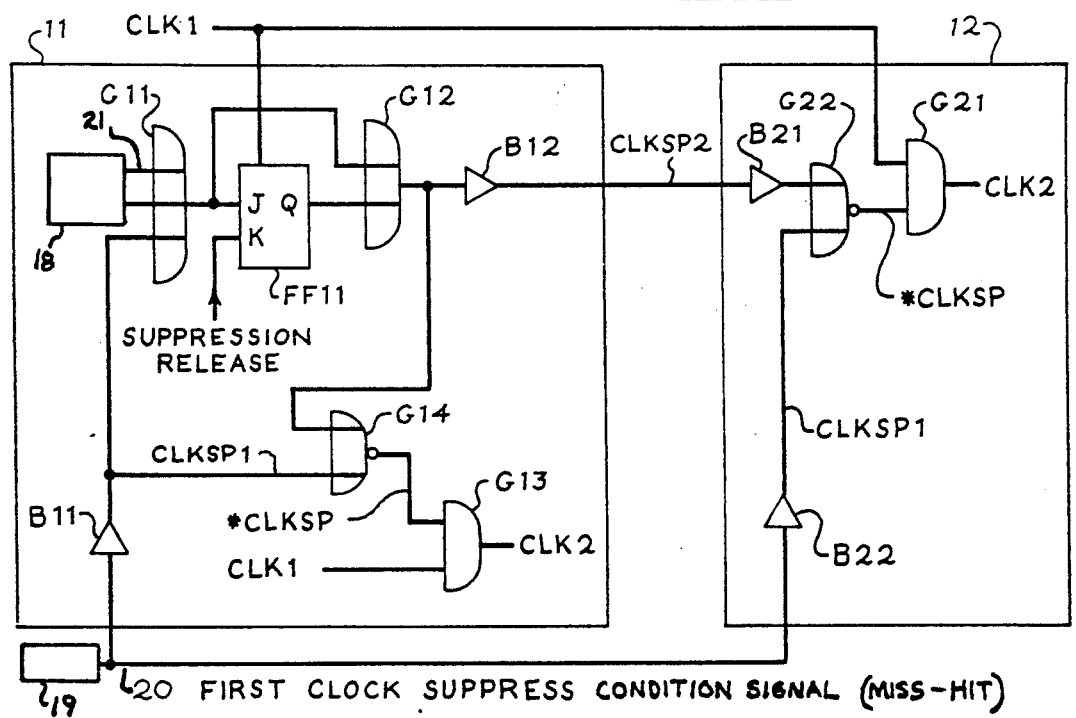
FIG. 8 is a block diagram of the first embodiment of the present invention.
Figure 9:
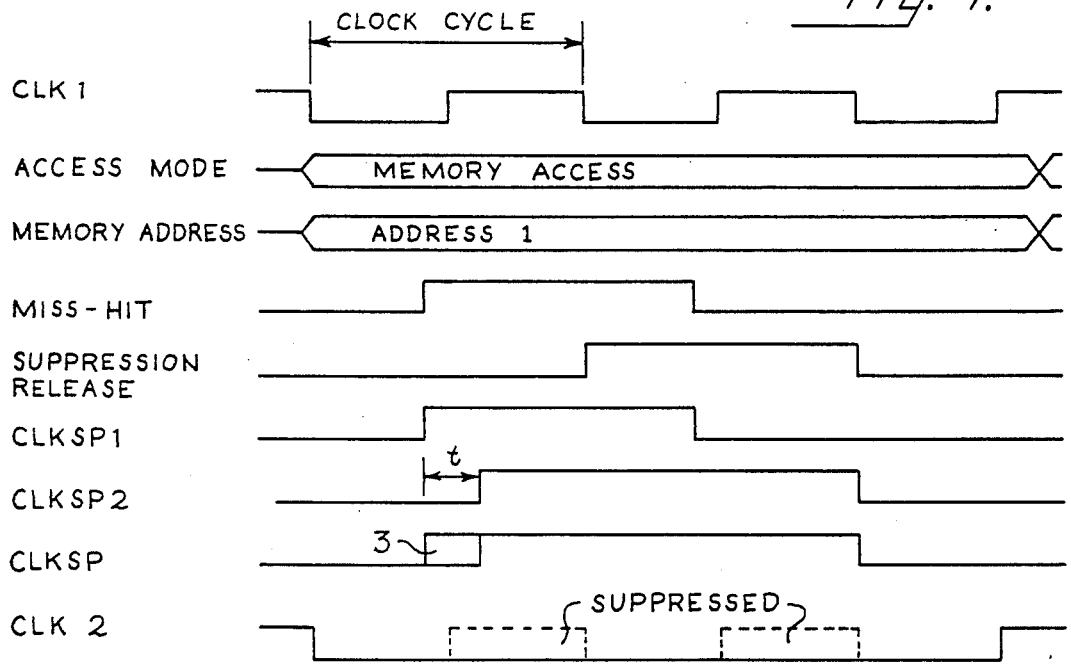
FIG. 9 is a timing chart showing the occurrence of a cache miss to the circuit of FIG. 8.

FIG. 8 is a block diagram of the first embodiment of the present invention. FIG. 9 is a timing chart showing the occurrence of a cache miss to the circuit of FIG. 8.

Figure 1:
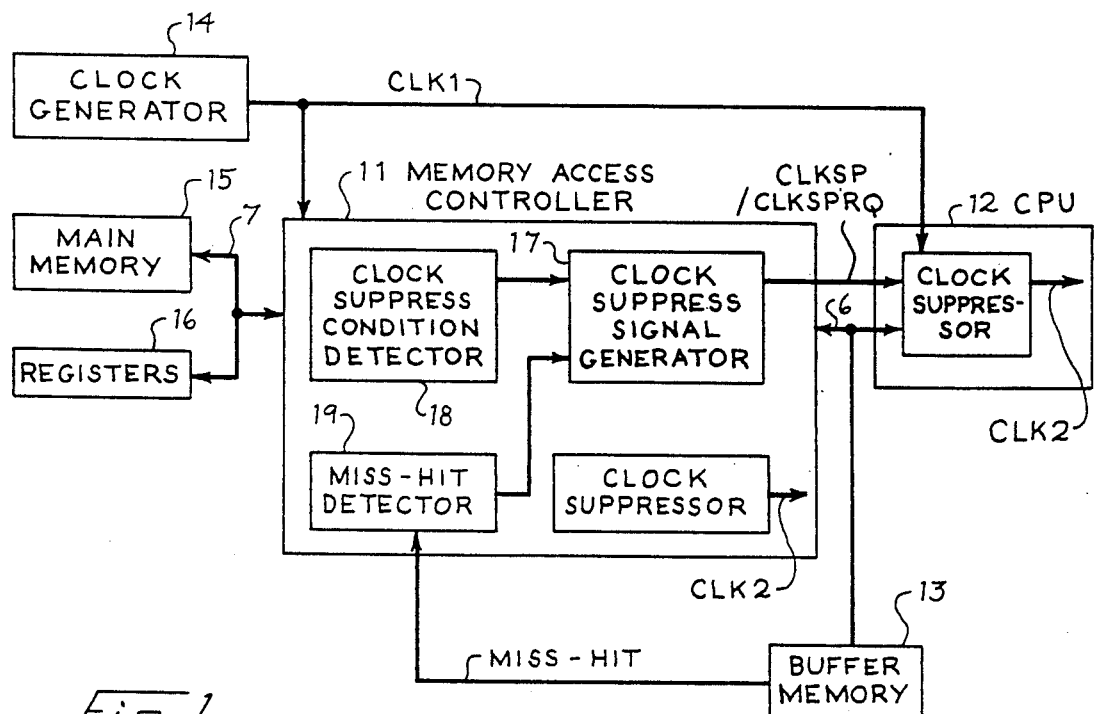
FIG. 1 is a block diagram of a computer system for practicing the present invention.
Figure 2:
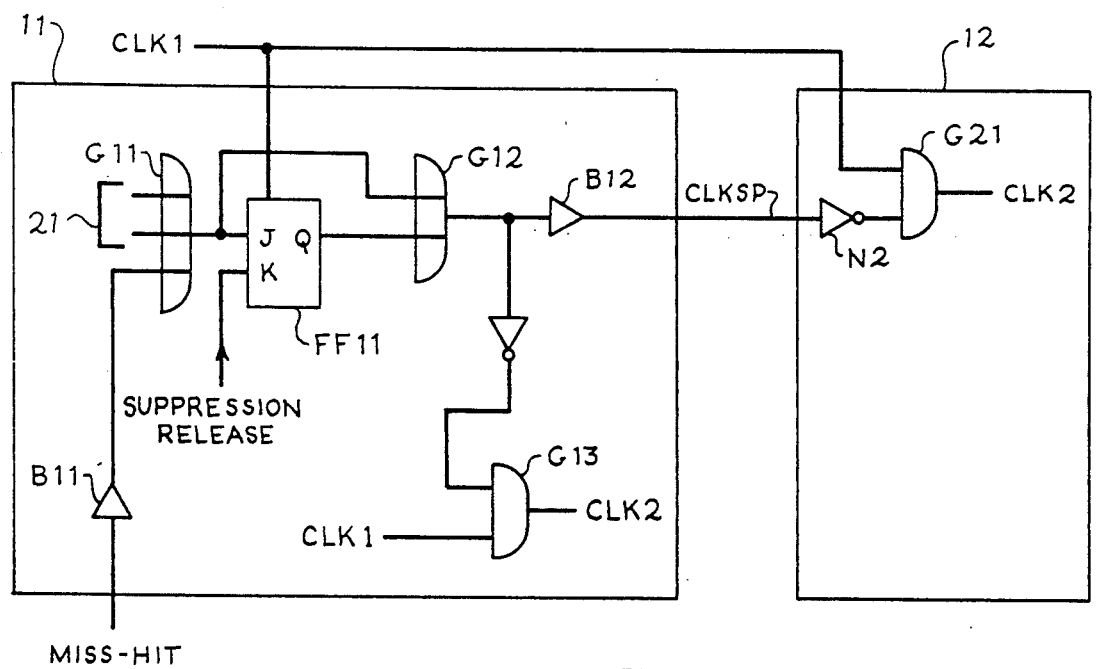
FIG. 2 is a circuit showing the first related art.

In FIG. 8, the circuit configuration is similar to that shown in FIG. 2, except that a NOR gate G14 is added to the memory access controller 11, and a NOR gate G22 and a buffer B22 for receiving a miss-hit signal MISS-HIT to the CPU 12.

When a cache miss occurs and the MISS-HIT signal is activated for 1 clock cycle period, the memory access controller 11 receives the MISS-HIT signal into the NOR gate G14 via the buffer B11 to generate a 1-cycle long clock suppress signal *CLKSP. The system clock pulse CLK1 is gated by the AND gate G13 to generate a receive clock pulse CLK2. In the same way, the CPU 12 receives the MISS-HIT signal into the NOR gate G22 via the buffer B22 to generate a 1-cycle long clock suppress signal *CLKSP. The clock pulse CLK1 is gated by the AND gate G21 to generate a receive clock pulse CLK2.

Meanwhile, the MISS-HIT signal received by the memory access controller 11 is also input to the flip-flop FF11 via the OR gate G11, to be held therein. The output of the flip-flop FF11 is sent to the CPU 12 via the buffer B12 as a second clock suppress signal CLKSP2. In the CPU 12, the second clock suppress signal CLKSP2 received via the buffer B21 is ORed with the first clock suppress signal CLKSP1 to gate the system clock pulse CK1 to generate the receive clock pulse CLK2.

Accordingly, even if activation of the second clock suppress signal CLKSP2 is delayed, the system clock pulse is suppressed by the first clock suppress signal CLKSP1 for the first 1 clock cycle, and even if the first clock suppress signal CLKSP1 becomes inactive after that clock cycle, the system clock pulse stays suppressed by the second clock suppress signal CLKSP2. Then, when the suppression release signal becomes active and the second clock suppress signal CLKSP2 becomes inactive, clock suppression is released.

FIG. 9 is a timing chart showing the occurrence of a cache hit to the circuit of FIG. 8.

Being transmitted via the memory access controller 11, the second clock suppress signal CLKSP2 reaches the CPU 12 later than the MISS-HIT signal by the time t, for example. However, since the second clock suppress signal CLKSP2 is ORed by the NOR gate G22 with the first clock suppress signal CLKSP1 which is created directly from the MISS-HIT signal, it means that the clock suppress signal *CLKSP reaches the CPU 12 earlier than the equivalent in FIG. 2, by the time t (see reference numeral 3 in FIG. 9).

When a second clock suppress signal 21 occurs as in a register access mode, clock suppression is caused by the memory access controller in the same way as in the related art illustrated by FIG. 2, and the clock-suppress operation in this case and in a cache hit is performed in the same way as in the related art illustrated by FIG. 2.

Figure 5:
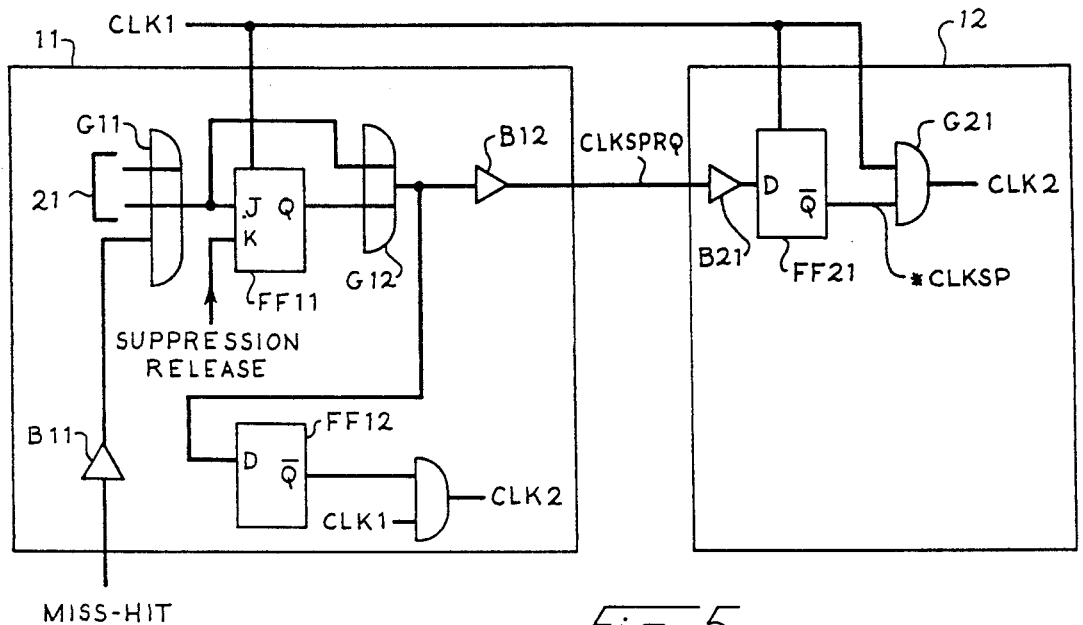
FIG. 5 is a circuit showing the second related art.
Figure 6:
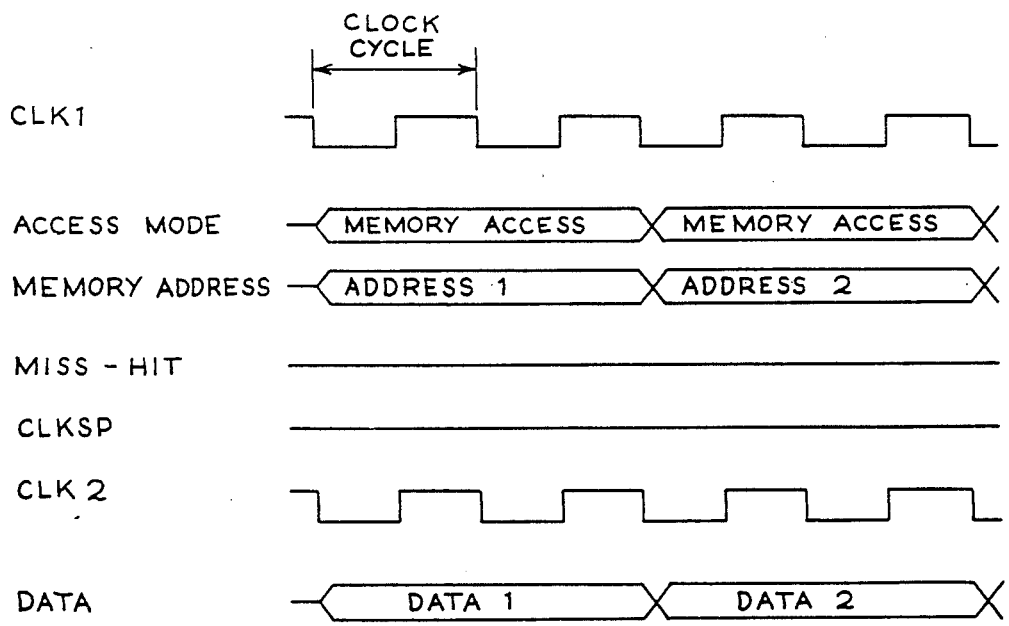
FIG. 6 is a timing chart showing the occurrence of a cache hit to the circuit of FIG. 5.
Figure 7:
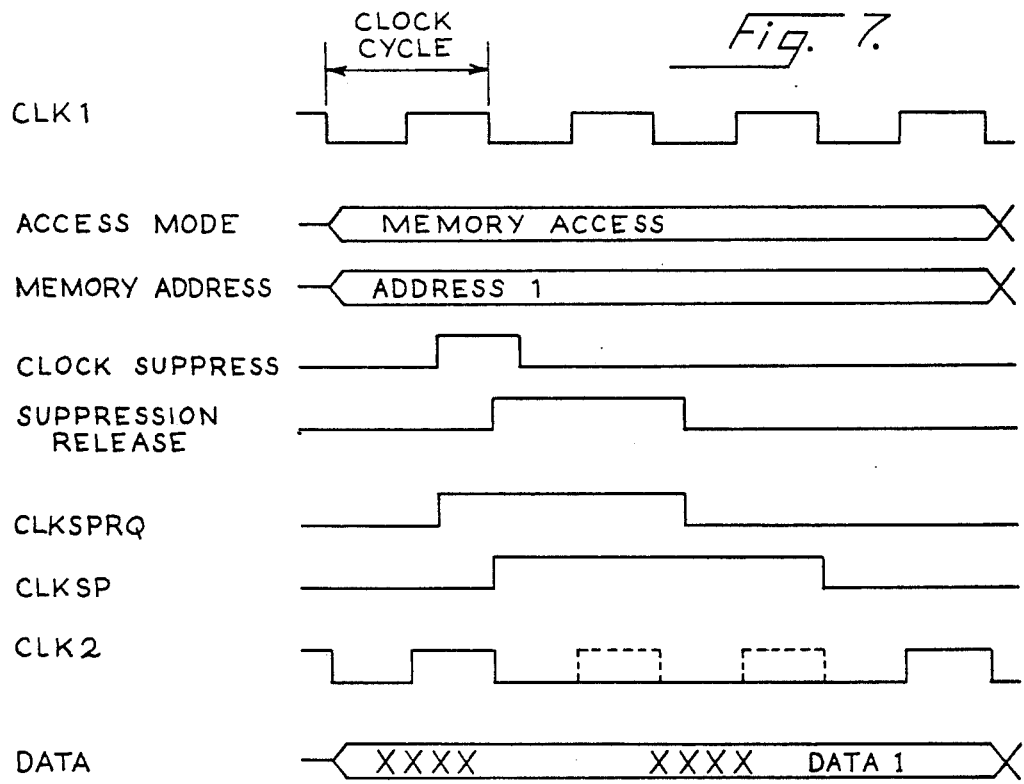
FIG. 7 is a timing chart showing the occurrence of a clock suppress condition to the circuit of FIG. 5.
Figure 10:
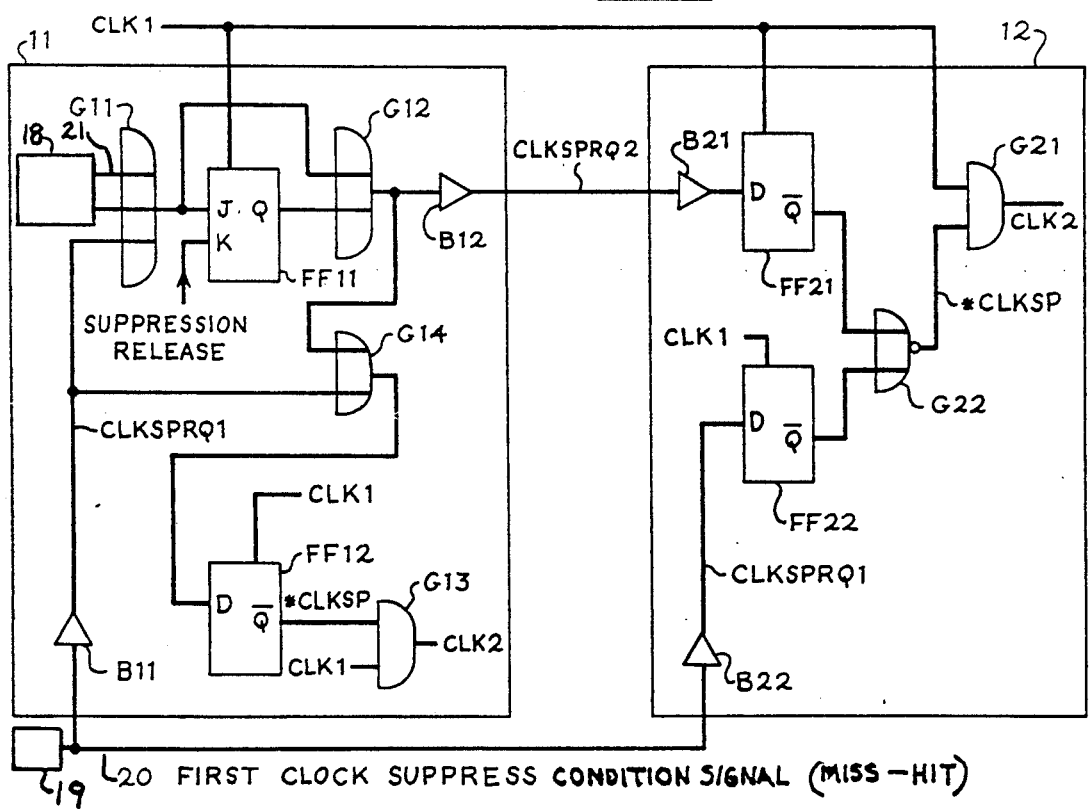
FIG. 10 is a block diagram of another embodiment of the present invention.

FIG. 10 is a block diagram of another embodiment of the present invention, which is an application of the present invention to the circuit in FIG. 5.

The circuit configuration in FIG. 10 is the same as in FIG. 5 except that an OR gate G14 is added to the memory access controller 11, and a NOR gate G22 and a D-type flip-flop FF22 are added to the CPU 12.

In FIG. 10, when a MISS-HIT signal is activated, the memory access controller 11 and CPU 12 receive the MISS-HIT signal via the buffers B11 and B22 as clock suppress request signal CLKSPRQ1 and input the CLKSPRQ1 signal to the flip-flops FF12 and FF22, respectively, to generate clock suppress signals *CLKSP with a delay of 1 clock cycle. The system clock pulse CLK1 is ANDed with the *CLKSP signal to produce the receive clock pulse CLK2 in the memory access controller 11 and CPU 12.

Meanwhile, the MISS-HIT signal received by the memory access controller 11 is also input to the flip-flop FF11 via the OR gate G11 to be held therein. The output of the flip-flop FF11 is used to control the receive clock pulse CLK2 within the memory access controller 11 and is also sent to the CPU 12 via the buffer B12 as a second clock suppress request signal CLKSPRQ2.

In the CPU 12, the second clock suppress request signal CLKSPRQ2 received via the buffer B21 is input to the flip-flop FF21 to provide an output after 1 clock cycle. The output is ORed with that from the flip-flop FF22 by the NOR gate G22, which gates the system clock pulse CLK1 to provide the receive clock pulse CLK2.

In the memory access controller 11, the first and second clock suppress request signals CLKSPRQ1 and CLKSPRQ2 are ORed and the output is provided to the flip-flop FF12 to generate the clock suppress signal *CLKSP, which is used to gate the system clock pulse CLK1 and to generate the receive clock pulse CLK2.

When 1 clock cycle has elapsed after a cache miss occurs, the receive clock pulse CLK2 is suppressed by the second clock suppress request signal CLKSPRQ2, and stays suppressed until a suppression release signal occurs.

When a second clock suppress signal 21 occurs, clock suppression is performed in the same way as described in the related art.

Accordingly, the first clock suppress conditions, including cache miss, which require a comparatively long time to be determined, are sent to all the devices, where the clock suppress signal CLKSP1 and clock suppress request signal CLKSPRQ1 are generated individually to suppress the receive clock pulse CLK2. Therefore, the present invention can save the time required to transmit a clock suppress signal from the memory access controller 11 to the CPU 12, and thus prevent a reduction in processing speed of a data processor caused by the first clock suppress conditions.

Although a memory system which requires two or more clock cycles for the receive clock pulse CLK2 to be suppressed is taken for an example here, for a memory system which requires only one clock cycle, the memory access controller 11 need not output the second clock suppress signal CLKSP2, even when the first suppress signal 20 occurs.

According to the present invention as described above, when the first clock suppress conditions occur which require a comparatively long time to be determined, the individual devices generate a clock suppress signal to suppress the receive clock pulse CLK2, and when other second clock suppress conditions occur, a particular device (e.g., the memory access controller 11) generates a clock suppress signal for all the devices to suppress the receive clock pulse CLK2. Therefore, the present invention can effectively prevent a data processing system from reducing in processing speed caused by clock suppress conditions which require a comparatively longer time to be determined.

While the principles of the invention have been described above in connection with specific apparatus and applications, it is to be understood that this description is made only by way of example and not as a limitation on the scope of the invention.

What is claimed is:

1. A clock control circuit for suppressing a clock pulse, wherein said clock pulse is provided in a plurality of devices which operate in synchronization with each other, said clock control circuit comprising:

first detection means for detecting a first clock suppress condition and generating a first clock suppress condition signal;

second detection means for detecting a second clock suppress condition;

clock suppress signal generator means coupled to an output of the first and second detection means, said clock suppress signal generator means being provided in a selected device for generating a second clock suppress condition signal based on the detection of a clock suppress condition by said first or said second detection means; and a plurality of clock suppression means provided in each of the devices, each of said clock suppression means being connected to said first detection means and said clock suppress signal generator means, for suppressing the clock pulse based on the first or second clock suppress signal.

2. A clock control circuit according to claim 1, wherein the plurality of devices include at least one memory device, the first and second clock suppress conditions occurring when data is not ready to be read from the memory device or written into the memory device.

3. A clock control circuit according to claim 2, wherein the first clock suppress condition includes a cache miss at the time when the memory device is to be accessed.

4. A clock control circuit according to any one of claims 1 to 3, wherein said first detection means generates said first clock suppress condition signal for suppressing a clock pulse for the first clock cycle, and said clock suppress signal generator means generates a clock suppress signal for the succeeding clock cycles.

5. A clock control circuit according to claim 4, wherein said clock suppress signal generator means comprises a flip-flop which is responsive to said first and said second detection means.

6. A clock control circuit according to claim 4, wherein said clock suppress signal generator means comprises a first OR gate which is responsive to said first and said second detection means, a flip-flop which is operatively connected to an output of said first OR gate, and a second OR gate which is responsive to the output of said first OR gate and an output of said flip-flop.

7. A clock control circuit according to claim 5, wherein said flip-flop is reset when data is ready to be read from the memory device or written into the memory device.

8. A clock control circuit according to claim 6, wherein said flip-flop is reset when data is ready to be read from the memory device or written into the memory device.

9. A clock control circuit according to any one of claims 1 to 3, wherein said clock suppression means comprises a NOR gate which is responsive to the first and second clock suppress signals and generates a resulting clock suppress signal; and an AND gate, which is responsive to the resulting clock suppress signal and said clock pulse which synchronizes in the plurality of devices.

10. A clock control circuit according to claim 4, wherein said clock suppression means comprises a NOR gate which is responsive to the first and second clock suppress signals and generates a resulting clock suppress signal; and an AND gate, which is responsive to the resulting clock suppress signal and said clock pulse which synchronizes the plurality of devices.

11. A clock control circuit according to any one of claims 2 or 3 wherein said clock suppression means suppresses the clock pulse with a clock-cycle unit delay in accordance with the clock cycles required for the memory device.

12. A method for suppressing a clock pulse in a clock control circuit which provides the clock pulse to a plurality of devices which operate in synchronization with each other, comprising the steps of:
    detecting a clock suppress condition;
    generating a first clock suppress signal, based on the detection of the clock suppress condition, in each of the devices simultaneously;
    generating a second clock suppress signal in a selected device, based on the detection of the clock suppress condition, the second clock suppress signal being generated during the time that the first clock suppress signal is generated and continuously thereafter until the second clock suppress signal is released;
    sending the second clock suppress signal to each of the devices; and
    suppressing the clock pulse in each of the devices based on said first and said second clock suppress signals, until said first and said second clock suppress signals are released.

13. Apparatus for suppressing a clock pulse in a clock control circuit which provides the clock pulse to a plurality of devices which operate in synchronization with each other, comprising:
    means for detecting a clock suppress condition;
    means for generating a first clock suppress signal, based on the detection of the clock suppress condition, in each of the devices simultaneously;
    means for generating a second clock suppress signal in a selected device, based on the detection of the clock suppress condition, the second clock suppress signal being generated during the time that the first clock suppress signal is generated and continuously thereafter until the second clock suppress signal is released;
    means for sending the second clock suppress signal to each of the devices; and
    means in each of the devices for suppressing the clock pulse based on said first and said second clock suppress signals until said first and said second clock suppress signals are released.

* * * * *